(12) United States Patent
Arai

(10) Patent No.: US 6,342,719 B1
(45) Date of Patent: *Jan. 29, 2002

(54) SEMICONDUCTOR DEVICE HAVING A DOUBLE-WELL STRUCTURE AND METHOD FOR MANUFACTURING THE SAME

(75) Inventor: Norihisa Arai, Omiya (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/863,014

(22) Filed: May 23, 1997

(30) Foreign Application Priority Data

May 23, 1996 (JP) .............................. 8-128059

(51) Int. Cl.[7] .............................. H01L 29/76
(52) U.S. Cl. .................. 257/371; 257/369; 257/509
(58) Field of Search ................ 257/371, 345, 257/500, 369, 509

(56) References Cited

U.S. PATENT DOCUMENTS 4,898,836 A  * 2/1990 Zambrano et al. ............ 437/31
5,547,894 A  * 8/1996 Mandelman et al. .......... 437/56
5,702,988 A  * 12/1997 Liang .......................... 438/238
5,729,156 A  * 3/1998 Sung ............................ 257/774
5,780,907 A  * 7/1998 Ema et al. ................... 257/371
5,990,535 A  * 11/1999 Palara ......................... 257/500

OTHER PUBLICATIONS

Kuriyama et al., "A 5V–Only 0.6um Flash EEPROM with Row Decoder Scheme in Triple–Well Structure", ISSCC 92 Session 9/Non–Volatile and Dynamic RAMS/Paper 9.3, pp. 152–153, 1992.

Dennard et al., "Design of Ion–Implanted MOSFET's with Very Small Physical Dimensions", IEEE Journal of Solid-–State Circuits, pp. 256–268, Oct. 1974.

* cited by examiner

Primary Examiner—Sara Crane
(74) Attorney, Agent, or Firm—Banner & Witcoff, Ltd.

(57) ABSTRACT

A first well of the same conductivity type as that of a semiconductor substrate and a second well of a conductivity type opposite to that of the semiconductor substrate, are formed in the semiconductor substrate. The second well isolates the semiconductor substrate and the first well from each other. Phosphorus ions for forming the bottom of the second well are implanted into the semiconductor substrate more deeply than boron ions for forming the first well. The depths to which these ions are implanted can be varied by acceleration energy of the ions. If the ions are so implanted, the total sum of impurities constituting the second well can be decreased within the surface area of the first well.

29 Claims, 15 Drawing Sheets

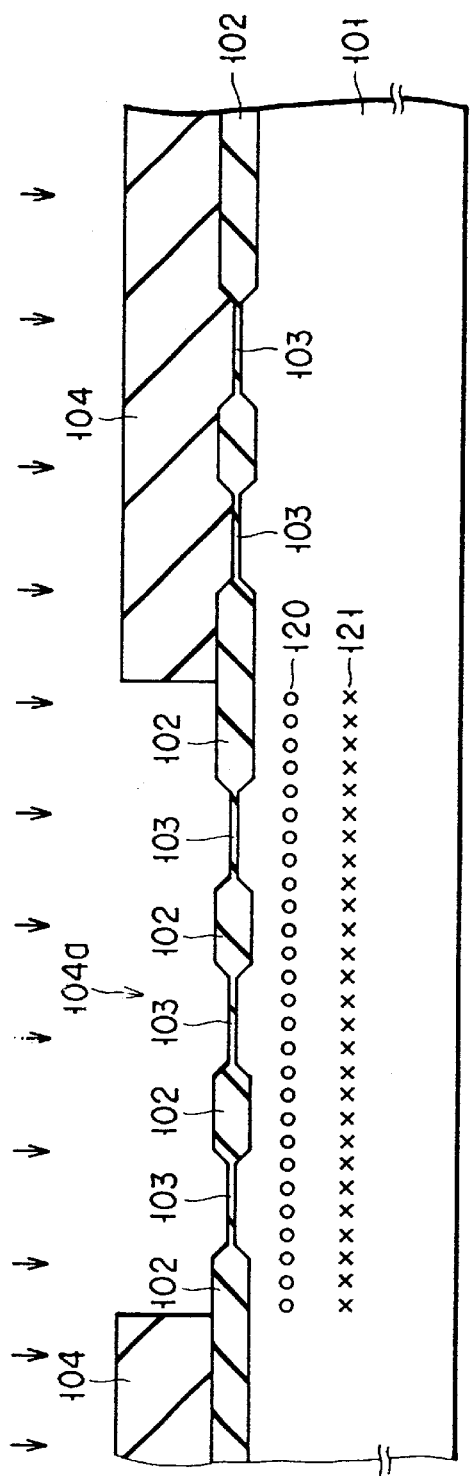
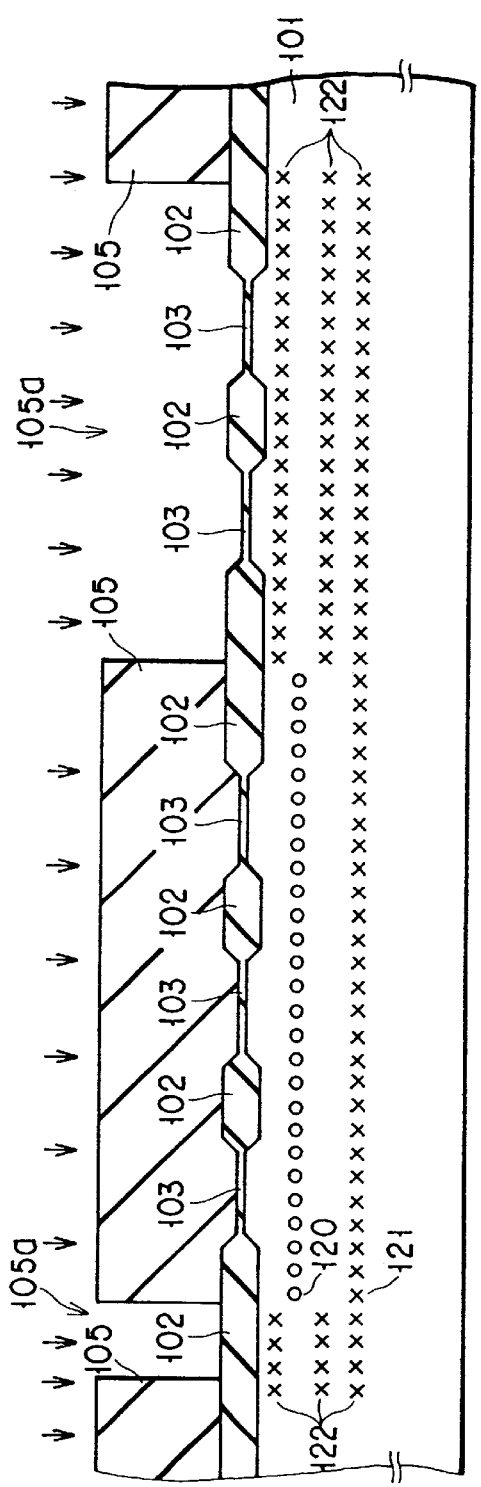
FIG. 1
FIG. 2

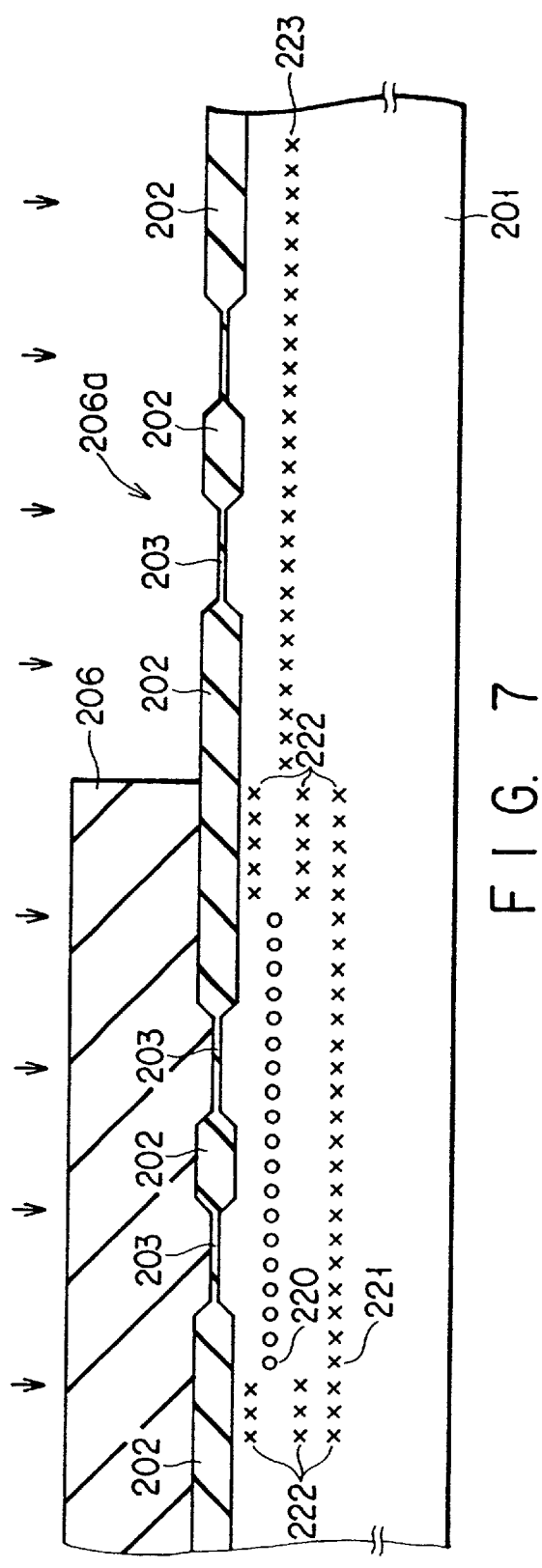
F I G. 7
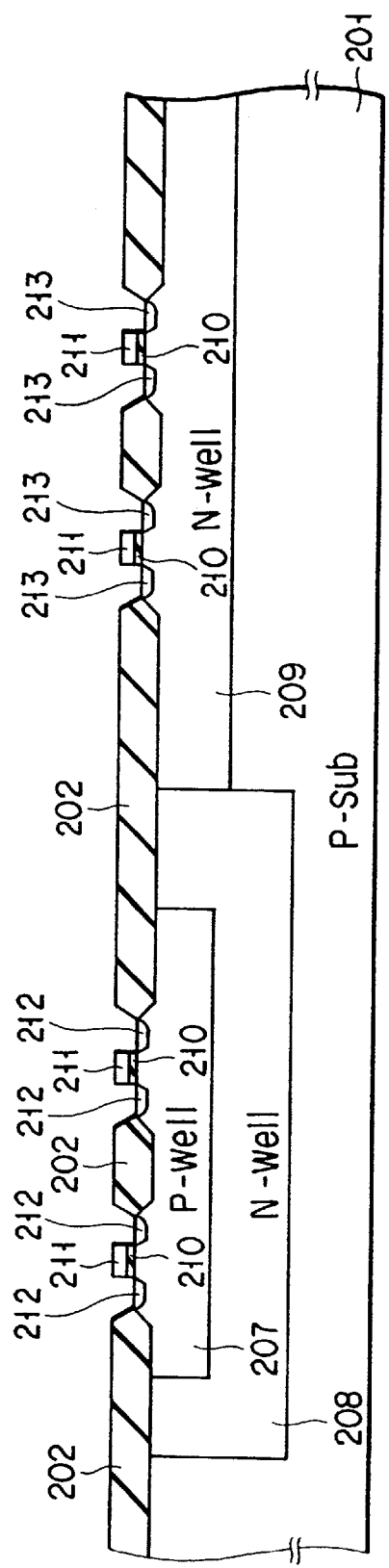
F I G. 8

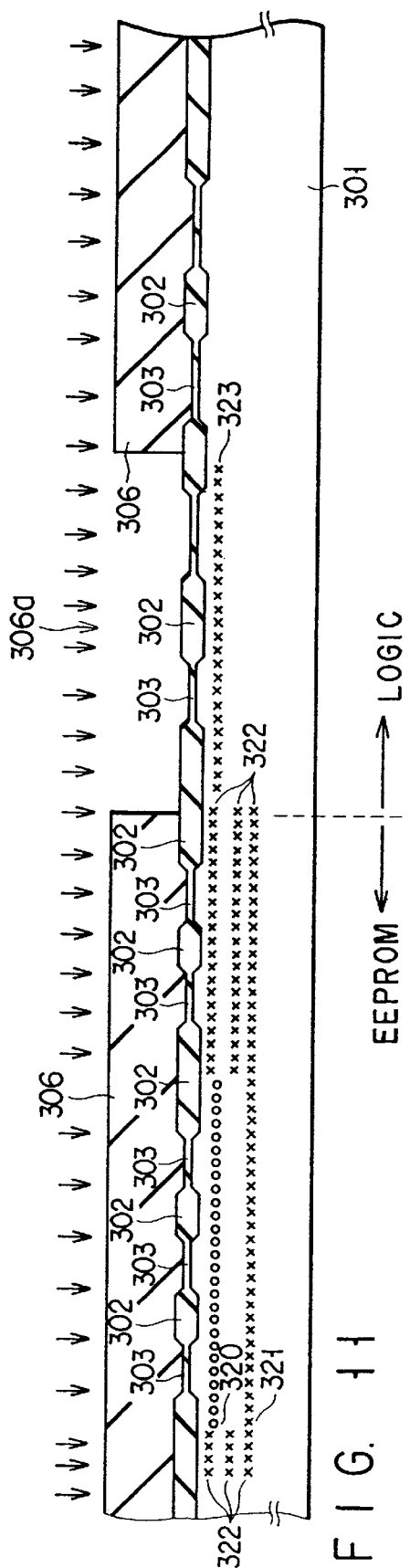
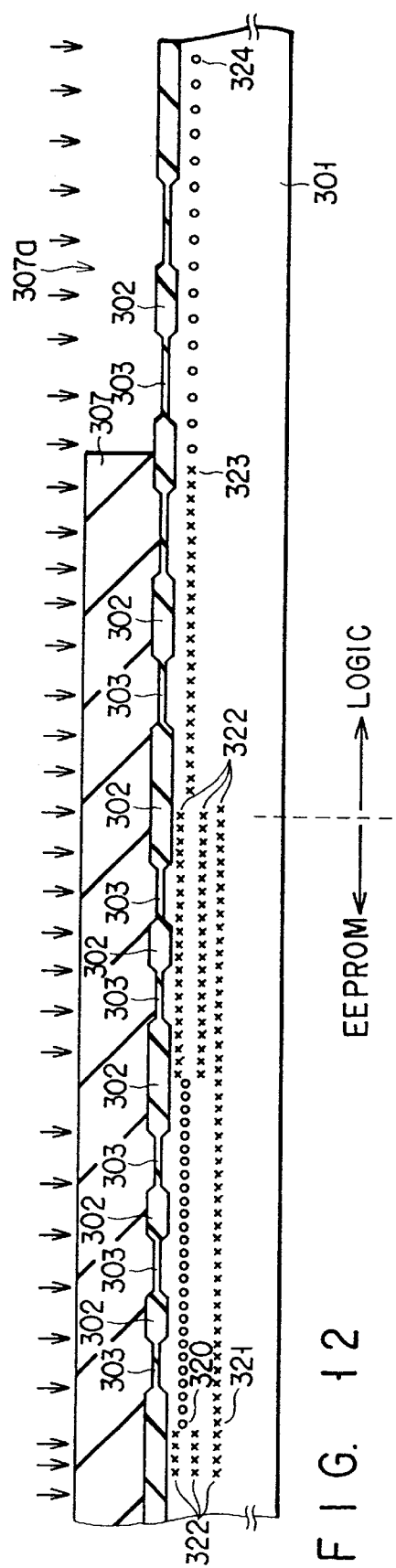
FIG. 11
FIG. 12

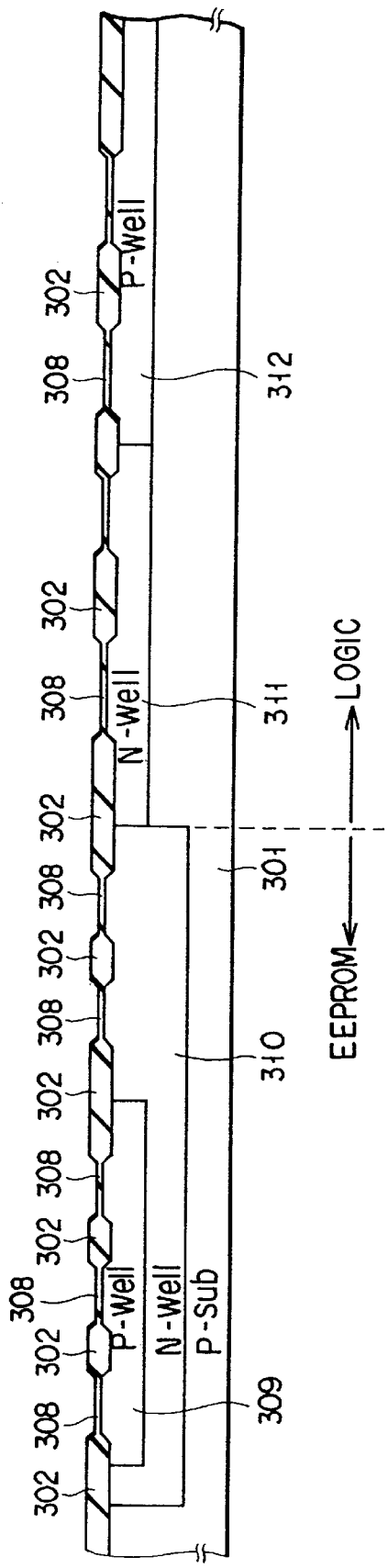
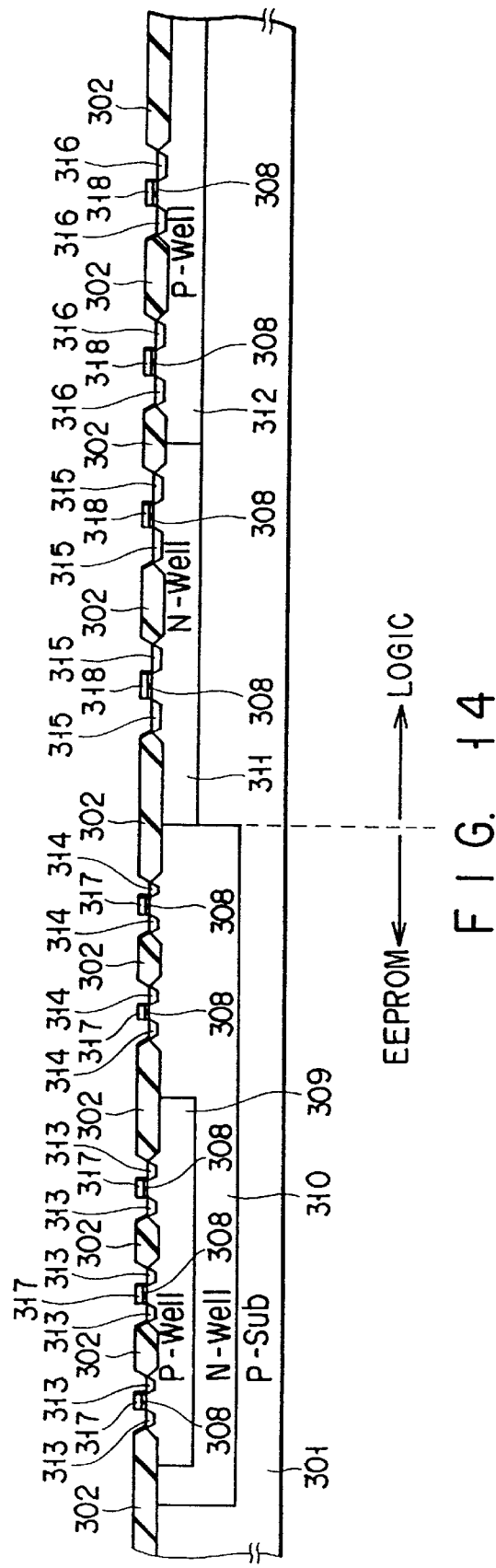
FIG. 13
FIG. 14

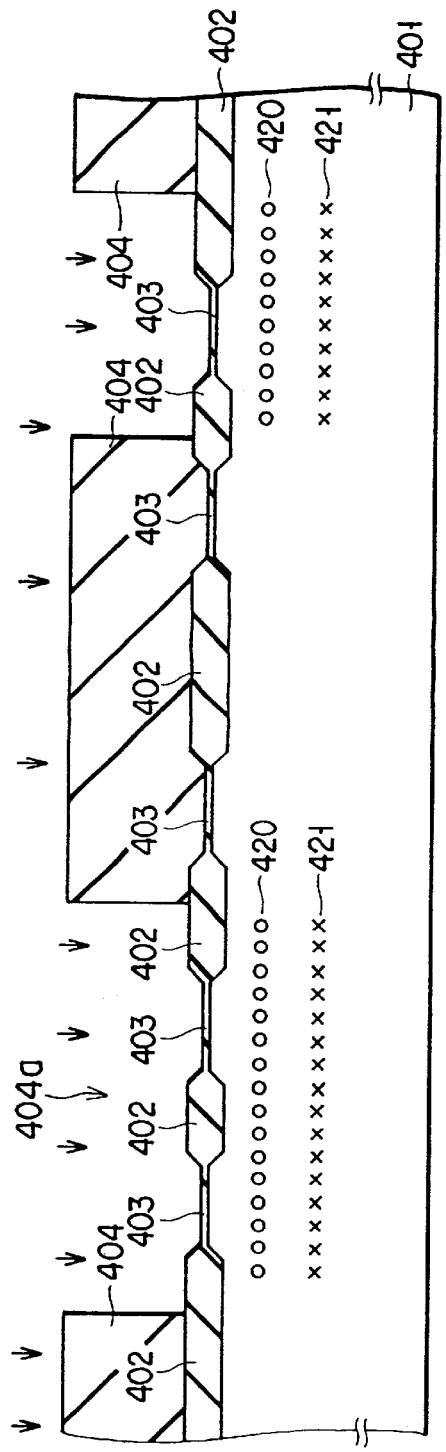
F I G. 15
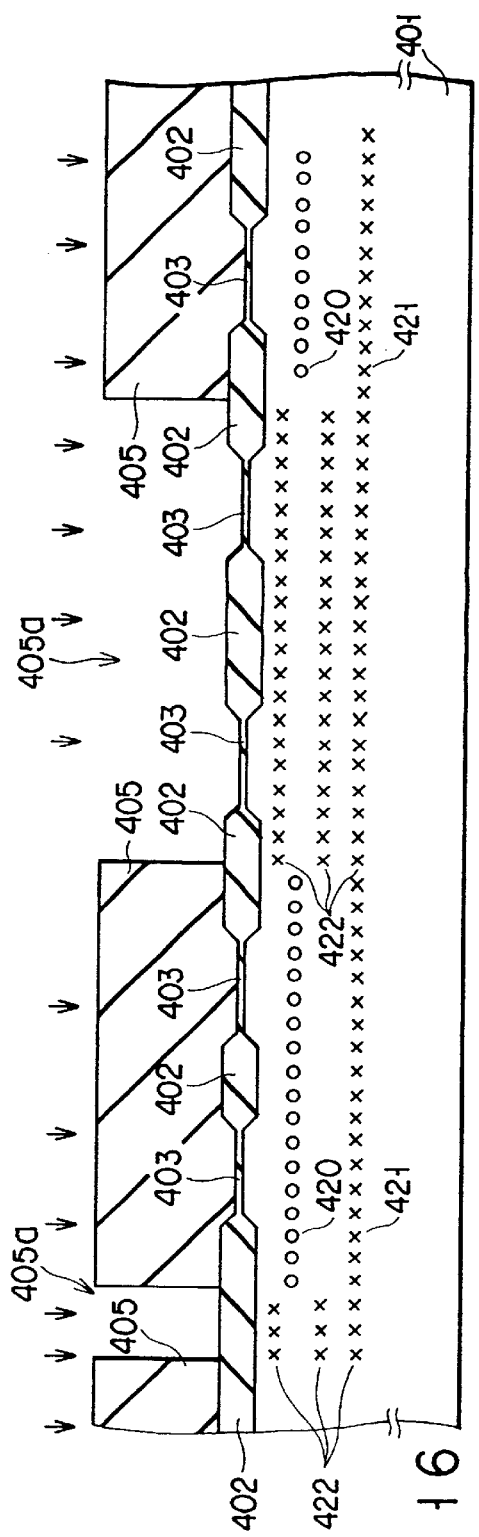
F I G. 16

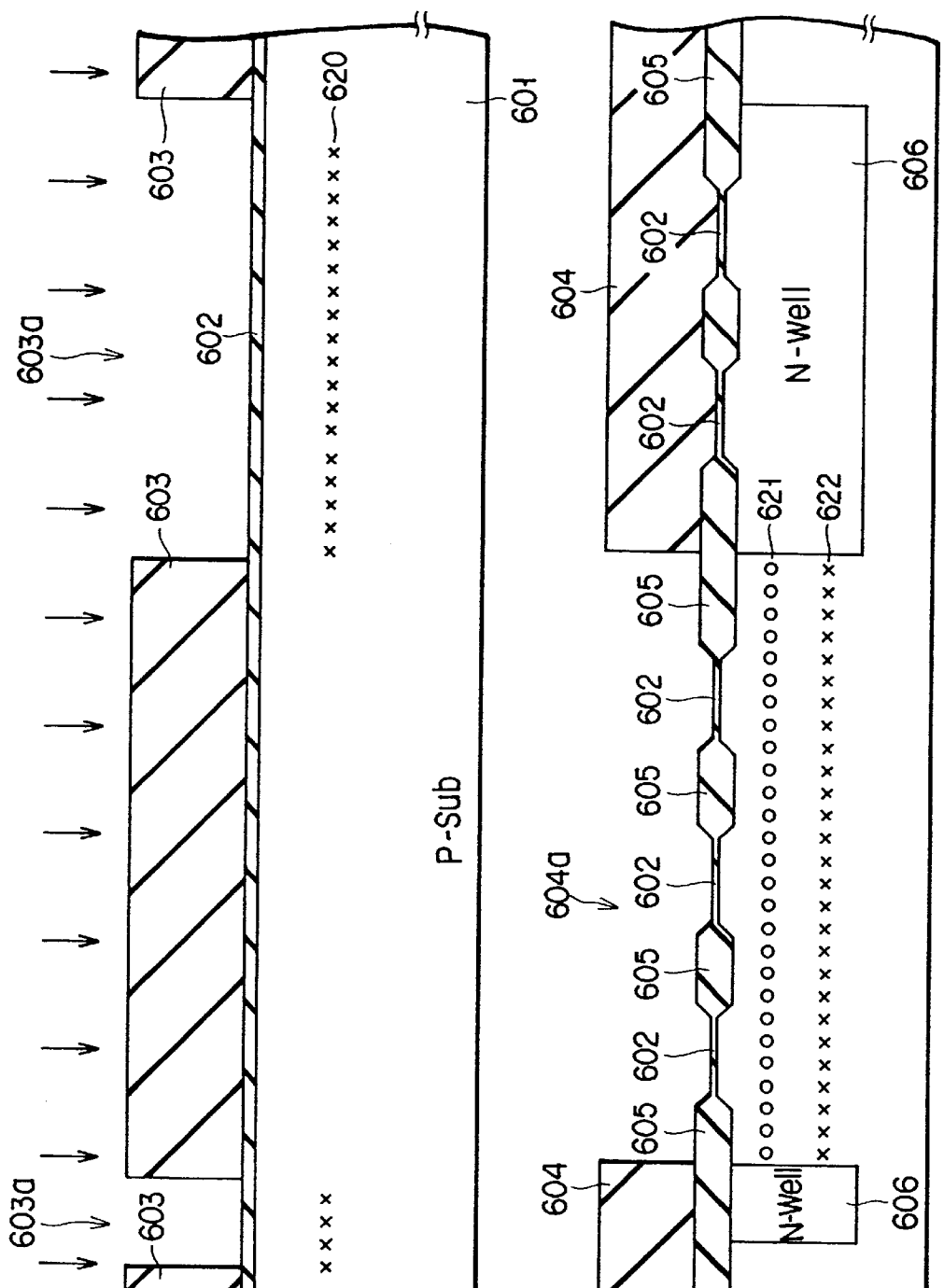
F I G. 23
F I G. 24

SEMICONDUCTOR DEVICE HAVING A DOUBLE-WELL STRUCTURE AND METHOD FOR MANUFACTURING THE SAME

BACKGROUND OF THE INVENTION

The present invention relates to a nonvolatile memory and, more particularly, to a semiconductor device having a double-well structure and a method for manufacturing the same.

A device such as a nonvolatile memory, in which a positive or negative potential is applied to a word line of a memory cell when data is written or erased, includes two MOSFETs of different conductivity-types in part of a peripheral circuit of the memory cell. Underlying substrates on which these MOSFETs are formed have to be electrically separated from each other. ISSCC 92, "A 5V-Only 0.6 μm Flash EEPROM with Row Decoder Scheme in Triple-Well Structure" discloses a method for separating a semiconductor substrate and a well of the same conductivity type as that of the substrate from each other, as illustrated in FIGS. 26 to 30.

Referring to FIG. 26, a silicon oxide film 702 is formed on a P-type silicon semiconductor substrate 701, and a resist pattern 703 having an opening 703a corresponding to an N-type well forming region is formed on the silicon oxide film 702. Using the resist pattern 703 as a mask, phosphorus ions 720 are implanted into the substrate 701.

The resist pattern 703 is removed and, as shown in FIG. 27, a plurality of silicon oxide films 704 for isolating elements are formed on the surface of the substrate 701. Moreover, the phosphorus ions 720 are activated to form an N-type well 705 in the substrate 701, and then a resist pattern 706 having an opening 706a corresponding to a P-type well forming region is formed on the substrate 701. Using the resist pattern 706 as a mask, boron ions 721 are implanted into the substrate 701.

The resist pattern 706 is removed and, as illustrated in FIG. 28, the boron ions 721 are activated to form a P-type well 707 in the substrate 701, and then a resist pattern 708 having an opening 708a corresponding to a PMOSFET forming region in the N-type well 705 is formed. Using the resist pattern 708 as a mask, for example, phosphorus ions 722 are implanted into the substrate 701.

The resist pattern 708 is removed and, as shown in FIG. 29, a gate oxide film 709 and a gate electrode wiring pattern 710 are formed and then N- and P-type diffusion layers 711 and 712 serving as source and drain regions are formed.

In the semiconductor device manufactured by the above-described method, the P-type well 707 and P-type silicon substrate 701 are electrically isolated from each other since the P-type well 707 is surrounded with the N-type well 705. However, the semiconductor device has the following drawback.

A number of phosphorus ions 720, which are implanted when the N-type well 705 is formed, are present on the surface of the substrate 701. Thus, the boron ions 721 enough to cancel the phosphorus ions 720, have to be implanted in order to form the P-type well 707. On the surface of the P-type well 707 so formed, there are phosphorus ions 720 and boron ions 721 the number of which is larger than that of the ions 720, with the result that a large number of impurities will be included in a region within the P-type well 707 where a channel of the MOSFET is to be formed. It is thus well-known that the carrier mobility is lowered by the impurity scattering effect and the MOSFET cannot be switched at high speed.

FIG. 30 is a profile of a three-layered structure of the P-type well 707, N-type well 705 and P-type silicon substrate 701.

To compensate for the above drawback, there is a method for restricting the concentration of the phosphorus ions used for forming the N-type well 705 to a relatively low value. Naturally, the capability of separating the P-type well 707 and P-type semiconductor substrate 701 is lowered and thus a difference in potential therebetween cannot be sufficiently secured. Furthermore, the N-type well 705 has a PMOSFET forming region on its surface, and it is evident from the scaling rule that if its underlying substrate is low in impurity concentration, the PMOSFET cannot be miniaturized. Consequently, a step of implanting high-concentration phosphorus ions into the PMOSFET forming region on the N-type well 705, using the resist pattern 708 shown in FIG. 28, is essential for increasing the PMOSFET forming region in impurity concentration. This is however a factor in causing a great cost due to an increase in manufacturing step.

The profile of the channel of an NMOSFET formed on the surface of the P-type well 707 is a complicated one representing a mixture of phosphorus ions for forming the N-type well 705 and boron ions for forming the P-type well 707 and controlling the channel. The complicated profile varies the threshold voltage Vth of the NMOSFET, reduces the circuit margin, and decreases the yield.

In the foregoing conventional semiconductor device which necessitates electrically separating the semiconductor substrate and the well of the same conductivity type as that of the substrate, a number of impurities of two different types are mixed on the surface of the well. For this reason, neither the semiconductor substrate and well can be separated from each other nor the high performance of the MOSFET formed in the well can be achieved. To enhance the performance of the MOSFET, the number of masks is increased and so is the number of steps of forming and removing the masks, thus causing a problem of variations in characteristics of the MOSFET formed in the well having a conductivity type opposite to that of the semiconductor substrate.

BRIEF SUMMARY OF THE INVENTION

It is accordingly an object of the present invention to provide a high-performance semiconductor device achieved by controlling its profile and a method for manufacturing the same at low cost.

To attain the above object, there is provided a semiconductor device comprising:

a semiconductor substrate of a first conductivity type;

a first well of the first conductivity type formed on a surface region of the semiconductor substrate; and a second well of a second conductivity type formed in the semiconductor substrate so as to surround the side of the first well and the bottom thereof, wherein if the concentration of impurities of the second conductivity type in the first well is D1 and the concentration of impurities of the second conductivity type in the second well is D2, D1<D2.

According to the semiconductor device so constituted, the second well electrically isolates the semiconductor substrate and first well from each other. Since no impurities of a conductivity type opposite to that of the substrate are present on the surface of the first well, other impurities are not required to cancel the impurities of the opposite conductivity type. Thus, the total sum of impurities of a channel region of a MOSFET formed in the first well is decreased, with the result that the MOSFET is improved in driving performance to allow a high-speed operation.

There is also provided a method for manufacturing a semiconductor device, comprising:

a first step of implanting first conductivity type impurity ions and second conductivity type impurity ions at least in a first well forming region of a semiconductor substrate of a first conductivity type to different depths, the first conductivity type impurity ions constituting a first well;

a second step of implanting the second conductivity type impurity ions in a region around the first well forming region, the second conductivity type impurity ions implanted in the second step and the second conductivity type impurity ions implanted in the first step constituting a second well; and a third step of activating the first conductivity type impurity ions and the second conductivity type impurity ions to form the first well and the second well in the semiconductor substrate.

According to the manufacturing method described above, when the first and second wells are formed, the impurity ions of the same conductivity type as that of the semiconductor substrate and those of the conductivity type opposite to that of the substrate, are implanted into the first well forming region. These impurity ions are implanted into the substrate to their different depths by varying acceleration energy. The concentration of impurities for forming the second well in the first well can thus be lowered.

The mask for forming the first well can be used for forming part of the second well. Thus, the number of masks can be reduced.

In the second step, the concentration of the second impurity ions implanted into the substrate can be controlled. There is a strong possibility that the region to which the impurity ions are implanted in the second step will be a MOSFET forming one, and the device can be miniaturized by controlling the concentration of the impurities of the region.

Since, furthermore, no step of controlling the impurity concentration of the MOSFET forming region is required, the manufacturing costs can be decreased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a cross-sectional view illustrating a manufacturing step of a semiconductor device according to the first embodiment of the present invention;

FIG. 2 is a cross-sectional view illustrating a next manufacturing step of FIG. 1;

FIG. 7 is a cross-sectional view illustrating a next manufacturing step of FIG. 6;

FIG. 8 is a cross-sectional view illustrating a next manufacturing step of FIG. 7;

FIG. 11 is a cross-sectional view illustrating a next manufacturing step of FIG. 10;

FIG. 12 is a cross-sectional view illustrating a next manufacturing step of FIG. 11;

FIG. 13 is a cross-sectional view illustrating a next manufacturing step of FIG. 12;

FIG. 14 is a cross-sectional view illustrating a next manufacturing step of FIG. 13;

FIG. 15 is a cross-sectional view illustrating a manufacturing step of a semiconductor device according to the fourth embodiment of the present invention;

FIG. 16 is a cross-sectional view illustrating a next manufacturing step of FIG. 15;

FIG. 23 is a cross-sectional view illustrating another manufacturing method of the semiconductor device according to the first embodiment of the present invention;

FIG. 24 is a cross-sectional view illustrating next manufacturing step of FIG. 23;

DETAILED DESCRIPTION OF THE INVENTION

Figure 3:
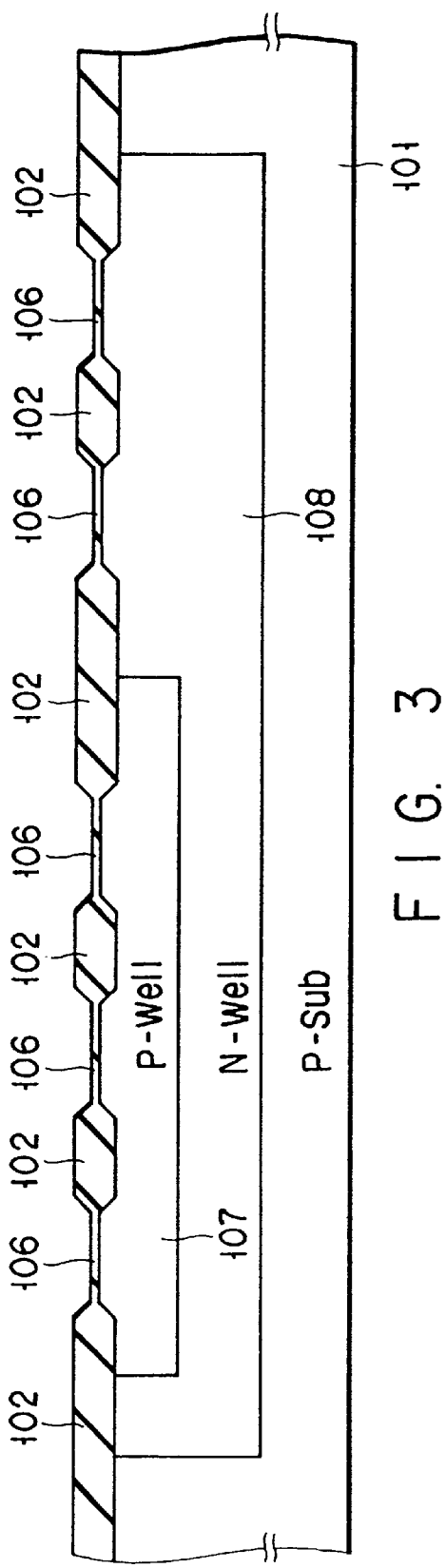
FIG. 3 is a cross-sectional view illustrating a next manufacturing step of FIG. 2.

A semiconductor device according to a first embodiment of the present invention and a method for manufacturing the same will now be described, with reference to the accompanying drawings. As an example of the semiconductor device, a flash EEPROM using positive and negative power supplies in write and erase modes is taken as follows.

As illustrated in FIG. 1, a plurality of element isolating oxide films 102 of about 600 nm in thickness are formed on a P-type silicon substrate 101 by LOCOS, and a silicon oxide film 103 of about 20 nm in thickness is formed on the surface of the substrate 101 by thermal oxidation. A resist pattern 104 having an opening 104a corresponding to a P-type well forming region which has to be electrically isolated from the P-type silicon substrate 101, is formed by lithography. Using the resist pattern 104 as a mask, boron ions 120 are implanted into the substrate 101 at an acceleration energy of 80 keV and a dose of $2.5E13/cm^2$, while phosphorus ions 121 are implanted thereinto at an acceleration energy of 3 MeV and a dose of $2E13/cm^2$. If the acceleration energy is so controlled, the boron ions 120 are implanted into the surface area of the substrate 101, and the phosphorus ions 121 are implanted more deeply than the boron ions 120.

As shown in FIG. 2, the resist pattern 104 is removed and then a resist pattern 105 surrounding the P-type well forming region and having an opening 105a corresponding to a PMOSFET forming region is formed. Using the resist pattern 105 as a mask, phosphorus ions 122 are implanted three times under the following conditions. The first condition is that the acceleration energy is 3 MeV and the dose is $2E13/cm^2$, the second condition is that the acceleration energy is 160 keV and the dose is $2E13/cm^2$, and the third condition is that the acceleration energy is 80 keV and the dose is $1E13/cm^2$. By controlling the acceleration energy, the phosphorus ions 122 are implanted so as to surround the boron ions 120 as illustrated in FIG. 2.

As shown in FIG. 3, after the resist pattern 105 is removed, the silicon oxide film 103 is removed, and a gate oxide film 106 of 20 nm in thickness is formed by dry oxidation at a temperature of 850° C. If the impurity ions implanted into the P-type silicon substrate 101 are activated, a P-type well 107 and an N-type well 108 are formed.

Figure 4:
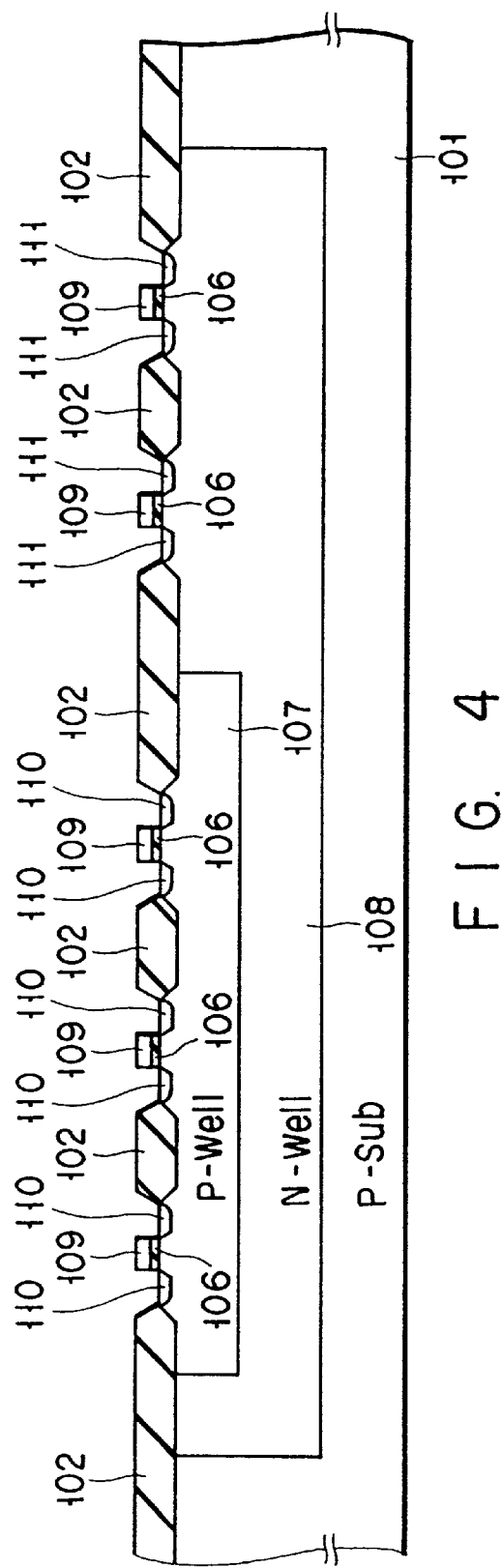
FIG. 4 is a cross-sectional view illustrating a next manufacturing step of FIG. 3.

As illustrated in FIG. 4, polysilicon which is a material for gate electrodes is deposited on the resultant structure by LPCVD and then etched to form a gate electrode wiring pattern 109. A high-concentration N-type diffusion layer 110 serving as the source/drain of the NMOSFET and a high-concentration P-type diffusion layer 111 serving as the source/drain of the PMOSFET are formed, though not shown in detail. In the steps described above, a peripheral circuit of the flash EEPROM using positive and negative power supplies in write and erase modes is constituted.

Figure 22:
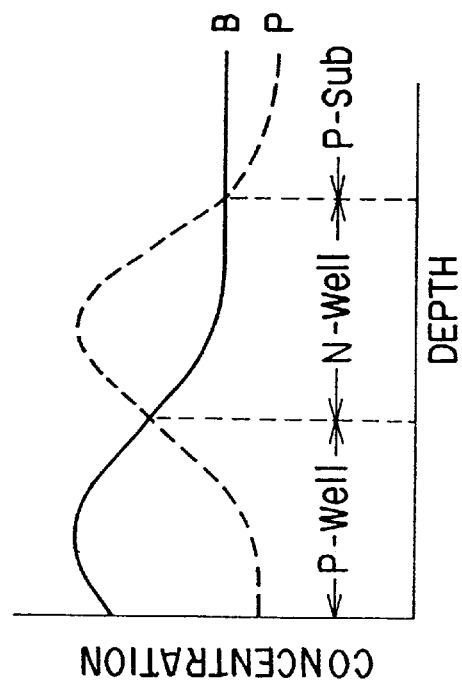
FIG. 22 is a profile of a region where a double well of the semiconductor device of the present invention.

FIG. 22 illustrates a profile of a three-layered structure of the P-type well 107, N-type well 108 and P-type silicon substrate 101. According to the present invention, the phosphorus ions 121 and 122 for forming the N-type well 108 are not present on the surface of the P-type well 107 and, in other words, there is no unnecessary phosphorus ions in that part of the surface of the P-type well 107 where a channel of the NMOSFET is to be formed. Consequently, the impurity scattering of the present invention is suppressed more than that of the conventional device described above, so that the mobility of carriers is increased, and the driving performance of the transistor is improved about 10%. Since no unnecessary phosphorus ions are present on the surface of the P-type well 107, the boron ions have only to be taken into consideration with respect to the profile of the P-type well when the device is designed, with the result that the device can easily be designed, the threshold voltage Vth can be prevented from varying, and the circuit margin is improved and thus the yield can be improved.

In the N-type well 108, the concentration of phosphorus can be set without being restricted by the step of forming the P-type well, and the phosphorus ions are implanted by controlling the acceleration energy and the dose. Thus, a complicated profile of the N-type well 108 can be controlled, with the result that both the high density and high performance of the PMOSFET can be achieved. In the conventional method for manufacturing a semiconductor device, the mask 708 having an opening corresponding to only the PMOSFET forming region is prepared to control the concentration of the impurities. In the present invention, even though the number of masks and the number of mask forming steps are small, the high density and high performance of the PMOSFET formed on the N-type well can be achieved, resulting in a decrease in manufacturing costs.

A semiconductor device according to a second embodiment of the present invention and a method for manufacturing the same will now be described, with reference to the accompanying drawings. As an example of the semiconductor device, a flash EEPROM using positive and negative power supplies in write and erase modes is taken as follows.

Figure 5:
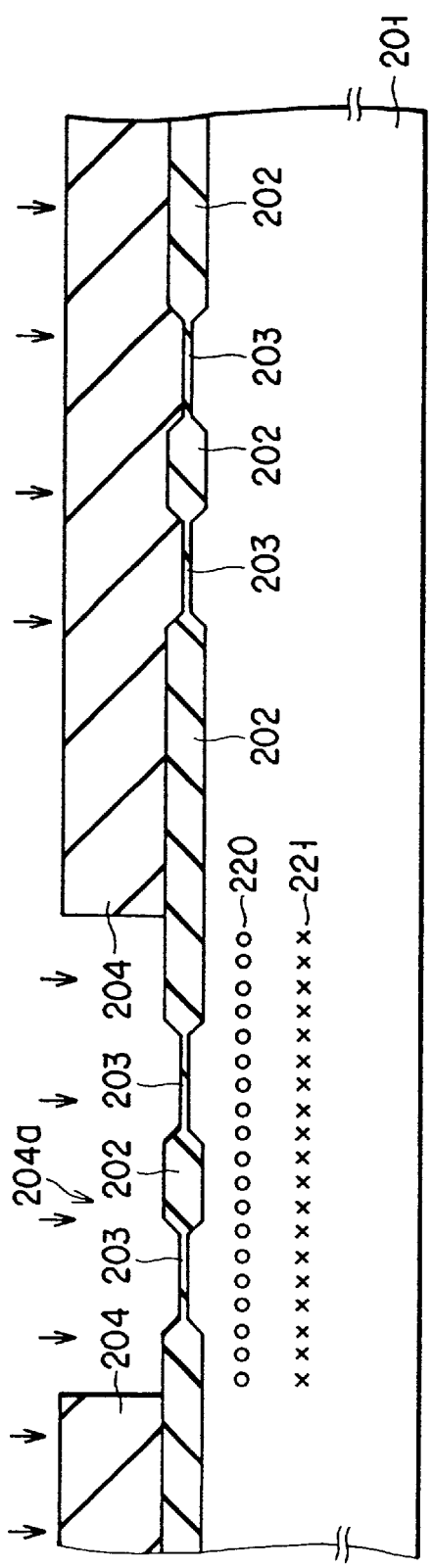
FIG. 5 is a cross-sectional view illustrating a manufacturing step of a semiconductor device according to the second embodiment of the present invention.

Like in the first embodiment, as illustrated in FIG. 5, a plurality of element isolating oxide films 202 and silicon oxide films 203 are formed on a P-type silicon substrate 201, and a resist pattern 204 having an opening 204a corresponding to a P-type well forming region which has to be electrically isolated from the P-type silicon substrate 201, is formed. Using the resist pattern 204 as a mask, boron ions 220 are implanted into the substrate 201 at an acceleration energy of 80 keV and a dose of $2.5E13/cm^2$, while phosphorus ions 221 are implanted thereinto at an acceleration energy of 3 MeV and a dose of $2E13/cm^2$.

Figure 6:
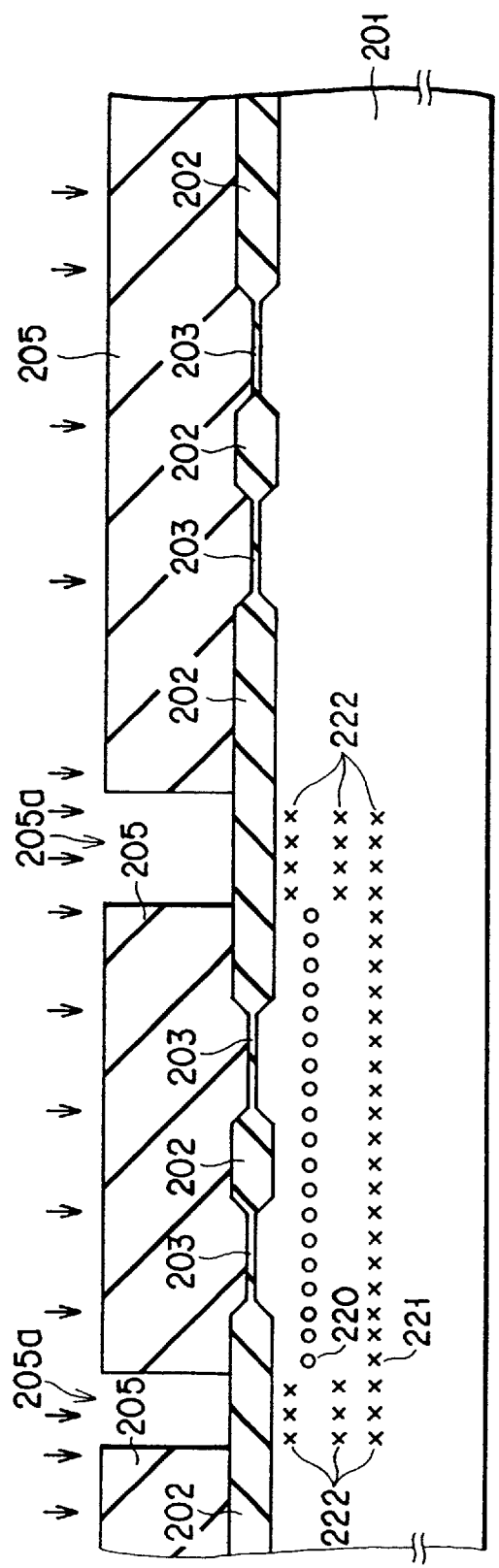
FIG. 6 is a cross-sectional view illustrating a next manufacturing step of FIG. 5.

As shown in FIG. 6, the resist pattern 204 is removed and then a resist pattern 205 is formed on the substrate 201. This resist pattern 205 surrounds the P-type well forming region and has an opening 205a corresponding to part of an N-well forming region. Using the resist pattern 205 as a mask, phosphorus ions 222 are implanted three times under the following conditions. The first condition is that the acceleration energy is 3 MeV and the dose is $2E13/cm^2$, the second condition is that the acceleration energy is 160 keV and the dose is $2E13/cm^2$, and the third condition is that the acceleration energy is 80 keV and the dose is $1E13/cm^2$.

The resist pattern 205 is removed and, as shown in FIG. 7, a resist pattern 206 having an opening 206a corresponding to the PMOSFET forming region is formed. Using the resist pattern 206 as a mask, phosphorus ions 223 are implanted.

After the resist pattern 206 is removed, the silicon oxide film 203 is done and, as shown in FIG. 8, a gate oxide film 210 is formed on the substrate. By activating the impurity ions implanted into the P-type silicon substrate 201, a P-type well 207, a first N-type well 208 and a second N-type well 209 are formed. After that, a gate electrode wiring pattern 211, a high-concentration N-type diffusion layer 212 serving as the source/drain of an NMOSFET and a high-concentration P-type diffusion layer 213 serving as the source/drain of a PMOSFET are formed, though not shown in detail.

In order to form a flash EEPROM and its peripheral circuit in each of the P-type well 207 and N-type wells 208 and 209, it is natural that the respective transistors require a high junction withstanding voltage since the power supply voltage used in write and erase modes is high. The junction withstanding voltage generally depends upon the PN concentration gradient. It is well-known that the junction withstanding voltage becomes lower as the PN concentration gradient. For example, a high withstanding voltage of about 30 V is required for the junction between the P-type well 207 and first N-type well 208. On the other hand, in order to miniaturize the MOSFET, it is essential to increase the concentrations of the wells, as is clear from the well-known scaling rule (Dennard, 1974). In other words, there is a contradiction between the low concentration of the wells to increase the junction withstanding voltage and the high concentration thereof to miniaturize the device.

However, according to the second embodiment, the concentration of the first N-type well 208 for separating the P-type well 207 and P-type silicon substrate 201 and that of the second N-type well 209 for forming the PMOSFET can be controlled so as to completely differ from each other.

In the semiconductor device and its manufacturing method of the second embodiment, the concentration gradient of the PN junction between the P-type well 207 and its surrounding first N-type well 208 can be made by using only the second N-type well 209 as an underlying layer for forming a very small PMOSFET and setting the concentration (approximately $6E16/cm^3$) of the first N-type well lower than that of the second N-type well. Thus, although the second embodiment has relatively high concentration (approximately $1E17/cm^3$) wells (P-type well 207 and second N-type well 209) capable of forming a very small MOSFET, a junction withstanding voltage can be increased by interposing the relatively low concentration first N-type well 208 between the P-type well 207 and second N-type well 209.

In a hybrid logic device mounted with a flash EEPROM, it is rare to make the design of a MOSFET of a logic of the device coincident with that of a MOSFET constituting the flash EEPROM. However, the coincidence can be achieved by combining the first and second embodiments described above. A semiconductor device including the EEPROM and logic and a method for manufacturing the same are illustrated in FIGS. 9 to 14 as a third embodiment of the present invention.

Figure 9:
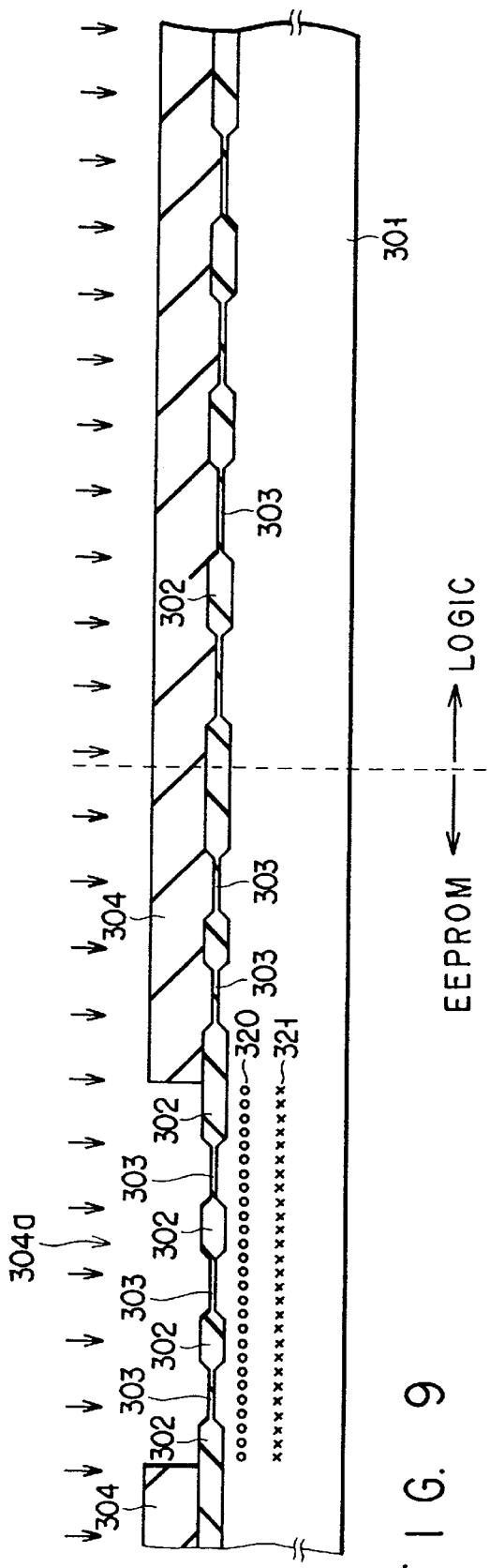
FIG. 9 is a cross-sectional view illustrating a manufacturing step of a semiconductor device according to the third embodiment of the present invention.

As shown in FIG. 9, an element isolating oxide film 302 and a silicon oxide film 303 are formed in a P-type silicon substrate 301. In the EEPROM, a resist pattern 304 having an opening 304a corresponding to a P-type well forming region is formed so as to cover the entire surface of the logic. Using the resist pattern 304 as a mask, boron ions 320 and phosphorus ions 121 are implanted into the substrate 301 under the same conditions as those of the first and second embodiments.

Figure 10:
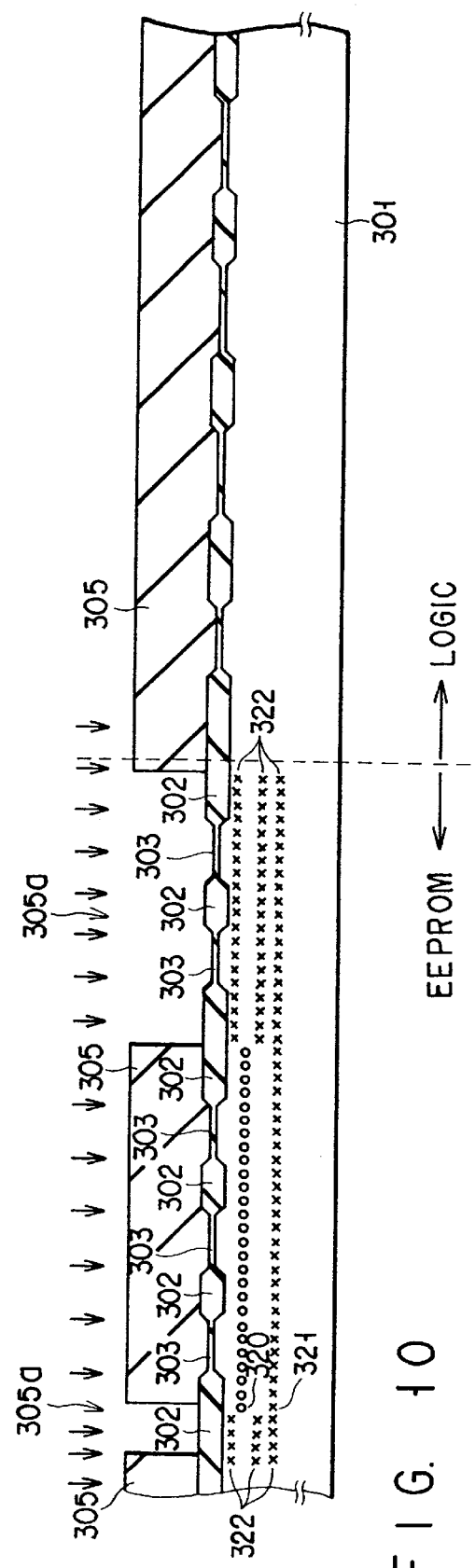
FIG. 10 is a cross-sectional view illustrating a next manufacturing step of FIG. 9.

The resist pattern 304 is removed and, as shown in FIG. 10, a resist pattern 305 surrounding a P-type well forming region and having an opening 305a corresponding to a PMOSFET forming region, is formed in the EEPROM so as to cover the entire surface of the logic. Using the resist pattern 305 as a mask, phosphorus ions 322 are implanted into the substrate 301. The step of implanting the ions is controlled by acceleration energy as that in the first and second embodiments.

The resist pattern 305 is removed and, as illustrated in FIG. 11, a resist pattern 306 having an opening 306a corresponding to an N-type well forming region is formed in the logic so as to cover the entire surface of the EEPROM. Using the resist pattern 306 as a mask, phosphorus ions 323 are implanted into the substrate 301.

The resist pattern 306 is removed and, as shown in FIG. 12, a resist pattern 307 having an opening 307a corresponding to a P-type well forming region is formed in the logic so as to cover the entire surface of the EEPROM. Using the resist pattern 307 as a mask, boron ions 324 are implanted into the substrate 301.

After the resist pattern 307 is removed, the silicon oxide film 303 is done and, as shown in FIG. 13, a gate oxide film 308 is formed by dry oxidation at a temperature of 850° C. Then, by activating the impurity ions implanted into the substrate 301, a P-type well 309, an N-type well 310, an N-type well 311, and a P-type well 312 are formed.

After that, as shown in FIG. 14, gate electrode wiring patterns 317 and 318 are formed on a gate oxide film 308, though not shown in detail. High-concentration N-type diffusion layers 313 and 316 serving as the source/drain in P-type wells 309 and 312, while high-concentration P-type diffusion layers 314 and 315 are formed in the N-type wells 310 and 311.

If, as described above, the step of forming the PMOSFET and its peripheral circuit by the manufacturing method of the first embodiment and the step of forming the second N-type well by that of the second embodiment are combined with each other, an EEPROM portion and a logic portion each having a desired profile can be constituted, with the result that a flash EEPROM and a logic can be designed simultaneously but separately from each other. This greatly reduces the development period for a hybrid logic device mounted with a flash EEPROM and the development expense therefor, thus creating a great effect.

A semiconductor device according to a fourth embodiment of the present invention and a method for manufacturing the same will now be described, with reference to the accompanying drawings. As an example of the semiconductor device, a flash EEPROM using positive and negative power supplies in write and erase modes is taken as follows.

Like in the first and second embodiments, as illustrated in FIG. 15, an element isolating oxide film 102 and a silicon oxide film 403 are formed on a P-type silicon substrate 401. A resist pattern 404 having an opening 404a corresponding to a P-type well forming region for an NMOSFET is formed on the substrate 401. Using the resist pattern 404 as a mask, boron ions 420 are implanted into the substrate 401 at an acceleration energy of 80 keV and a dose of $2.5E13/cm^2$, while phosphorus ions 421 are implanted thereinto at an acceleration energy of 3 MeV and a dose of $2E13/cm^2$.

The resist pattern 404 is removed and, as shown in FIG. 16, a resist pattern 405 having a portion surrounding a P-type well forming region which has to be electrically isolated from the P-type silicon substrate 401 and an opening 405a corresponding to an N-type well forming region, is formed. Using the resist pattern 405 as a mask, phosphorus ions 423 are implanted three times under the following conditions. The first condition is that the acceleration energy is 3 MeV and the dose is $2E13/cm^2$, the second condition is that the acceleration energy is 160 keV and the dose is $2E13/cm^2$, and the third condition is that the acceleration energy is 80 keV and the dose is $1E13/cm^2$.

Figure 17:
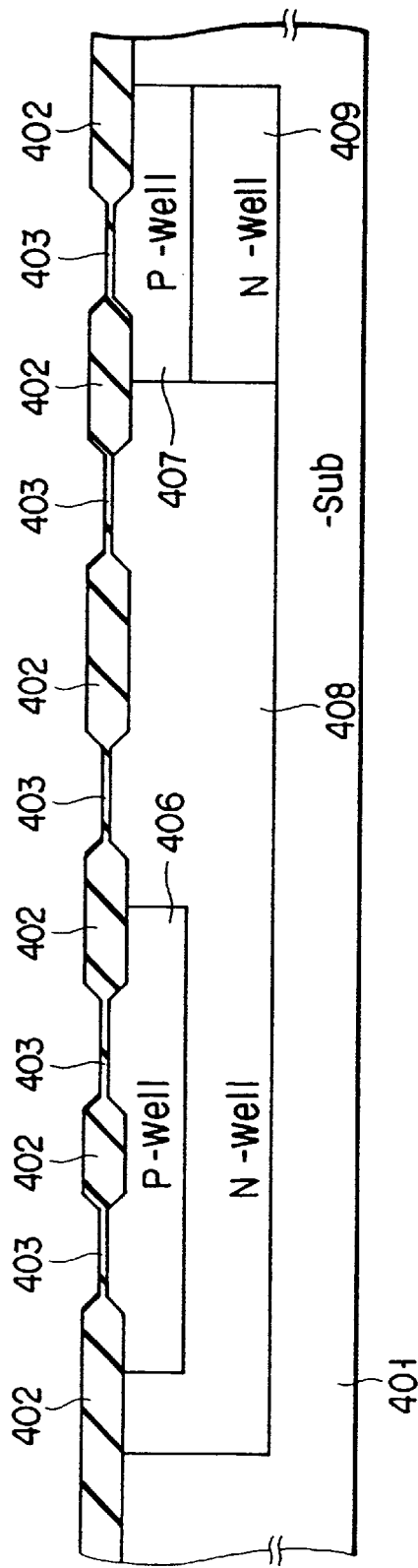
FIG. 17 is a cross-sectional view illustrating a next manufacturing step of FIG. 16.

The resist pattern 405 is removed and then the impurity ions implanted into the P-type silicon substrate 401 are activated to form first and second P-type wells 406 and 407 and first and second N-type wells 408 and 409, as illustrated in FIG. 17.

Figure 18:
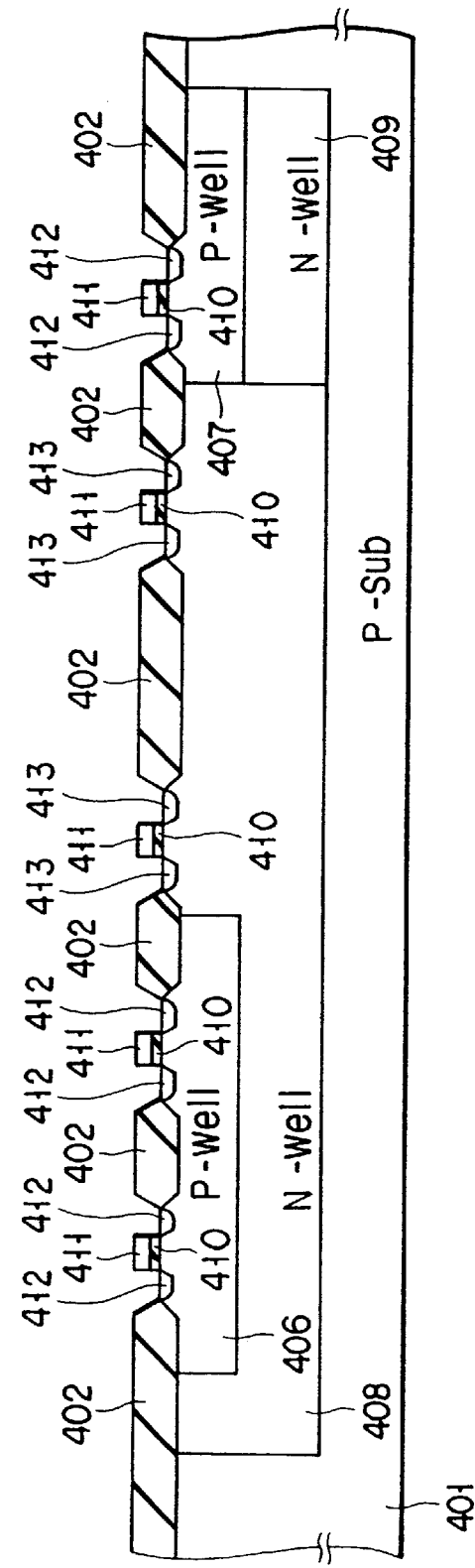
FIG. 18 is a cross-sectional view illustrating a next manufacturing step of FIG. 17.

After that, the silicon oxide film 403 is removed and, as shown in FIG. 18, a gate oxide film 410 is formed and a gate electrode wiring pattern 411 is formed on the gate oxide film 410, though not shown in detail. Moreover, a high-concentration N-type diffusion layer 412 serving as the source/drain of the NMOSFET is formed in the P-type wells 406 and 407, while a high-concentration P-type diffusion layer 413 serving as the source/drain of the PMOSFET is formed in the N-type well 408.

In view of the circuit arrangement, there are a P-type well which has to be electrically separated from the substrate 401 and a P-type well which need not be separated therefrom. The latter P-type well need not be surrounded by an N-type well. According to the fourth embodiment, since both the P-type well 406 electrically isolated from the P-type silicon substrate 401 and the P-type well not isolated therefrom can be formed, the extra N-type well surrounding the P-type well 407 can be eliminated, thus increasing in packed density.

Needless to say, the second and third embodiments can be combined with each other.

A semiconductor device according to a fifth embodiment of the present invention and a method for manufacturing the same will now be described, with reference to the accompanying drawings. As an example of the semiconductor device, a flash EEPROM using positive and negative power supplies in write and erase modes is taken as follows.

Figure 19:
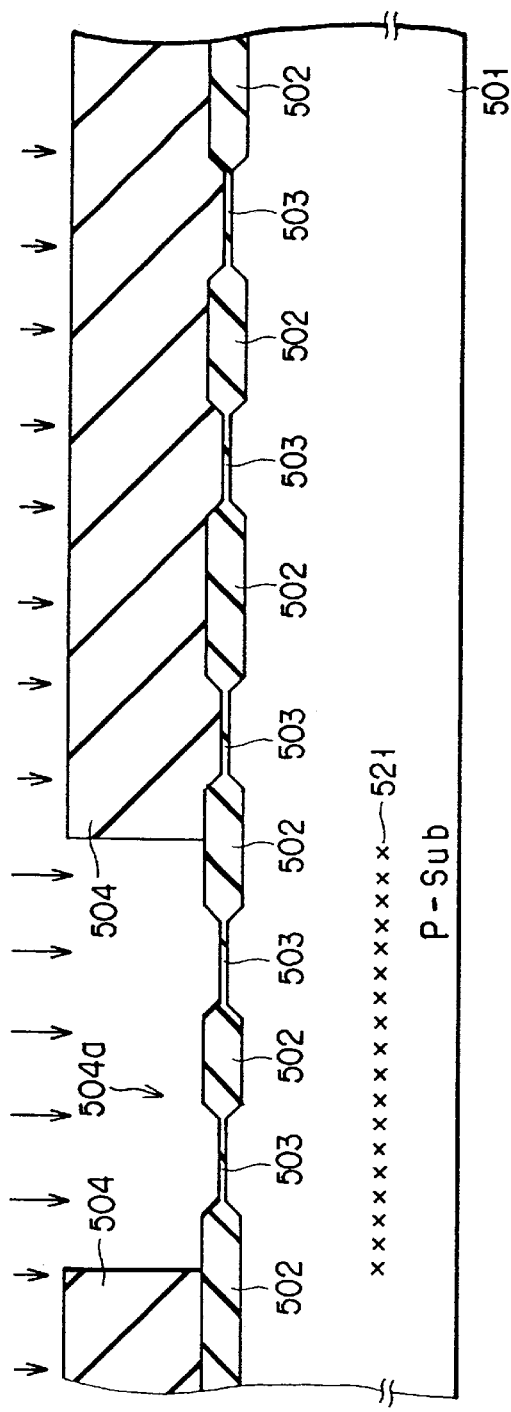
FIG. 19 is a cross-sectional view illustrating a manufacturing step of a semiconductor device according to the fifth embodiment of the present invention.

Like in the first to third embodiments, as illustrated in FIG. 19, an element isolating oxide film 502 and a silicon oxide film 503 are formed on a P-type silicon substrate 501. A resist pattern 504 having an opening 504a corresponding to an NMOSFET forming region which has to be electrically isolated from the a P-type silicon substrate 501. Using the resist pattern 504 as a mask, phosphorus ions 521 are implanted into the substrate 501 at an acceleration energy of 3 MeV and a dose of 2E13/cm$^2$.

Figure 20:
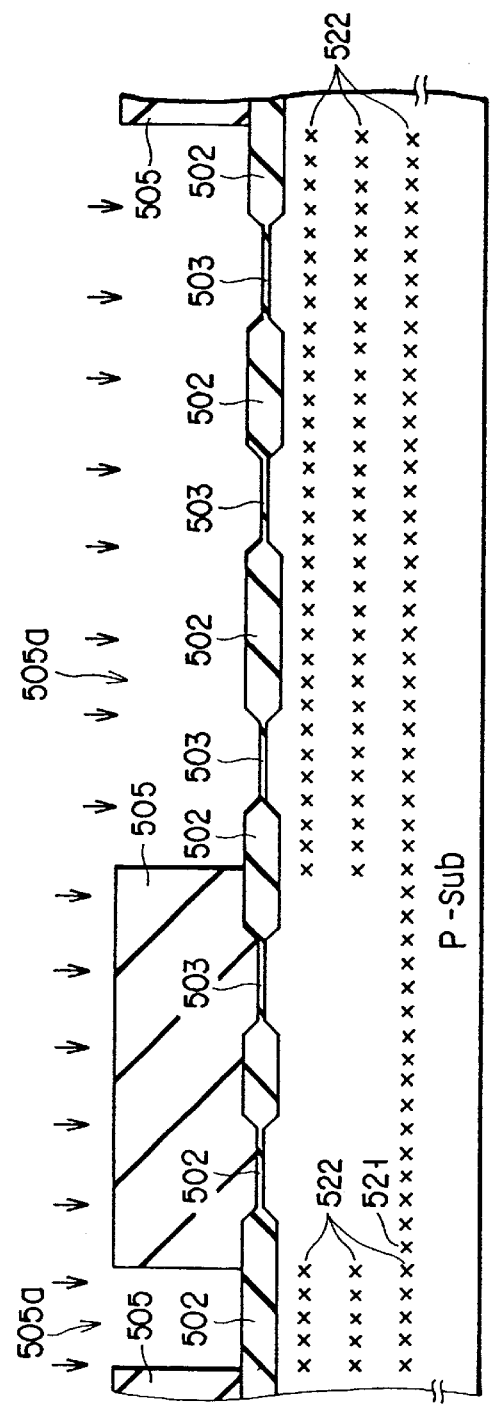
FIG. 20 is a cross-sectional view illustrating a next manufacturing step of FIG. 19.

The resist pattern 504 is removed and, as shown in FIG. 20, a resist pattern 505 surrounding the NMOSFET forming region which has to be electrically isolated from the P-type silicon substrate 501 and having an opening 505a corresponding to an N-type well forming region, is formed. Using the resist pattern 505 as a mask, phosphorus ions 522 are implanted three times under the following conditions. The first condition is that the acceleration energy is 3 MeV and the dose is 2E13/cm$^2$, the second condition is that the acceleration energy is 160 keV and the dose is 2E13/cm$^2$, and the third condition is that the acceleration energy is 80 keV and the dose is 1E13/cm$^2$.

Figure 21:
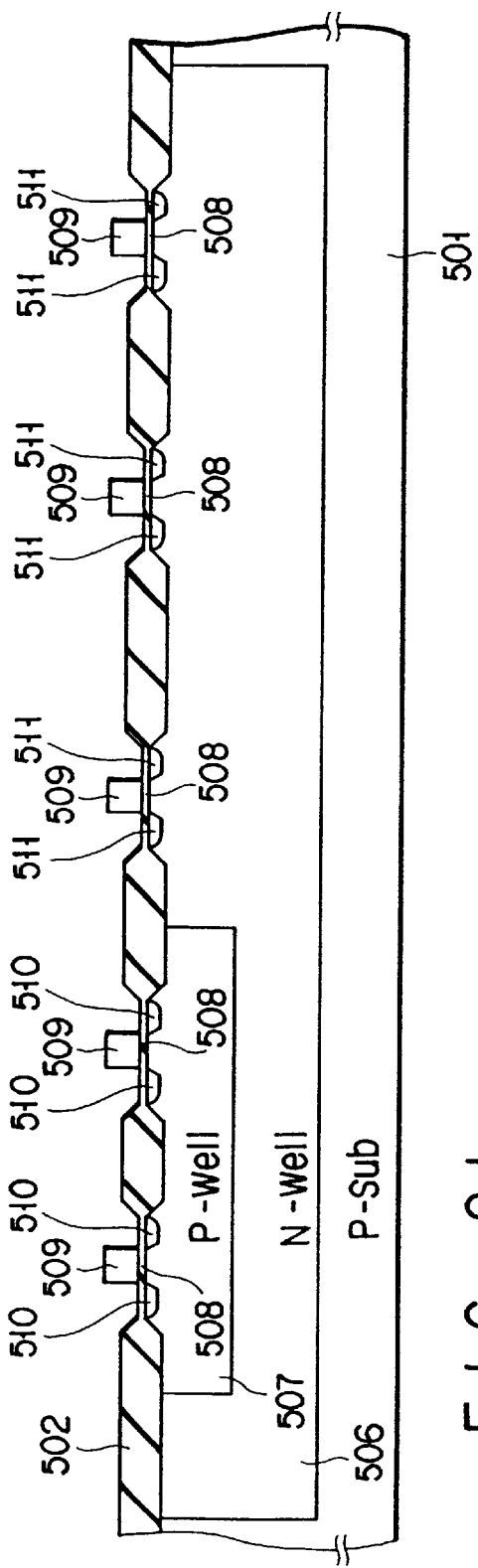
FIG. 21 is a cross-sectional view illustrating a next manufacturing step of FIG. 20.

The resist pattern 505 is removed and then the impurity ions implanted into the P-type silicon substrate 501 are activated to form an N-type well 506 and a P-type well 507 which can be electrically separated from the substrate 501, as illustrated in FIG. 21. After that, the silicon oxide film 503 is removed and then a gate oxide film 508 is formed. A gate electrode wiring pattern 509 is formed on the gate oxide film 508, though not shown in detail. Moreover, a high-concentration N-type diffusion layer 510 serving as the source/drain of the NMOSFET is formed in the P-type well 507, while a high-concentration P-type diffusion layer 511 serving as the source/drain of the PMOSFET is formed in the N-type well 506.

According to the fifth embodiment, since the P-type silicon substrate can be employed as an NMOSFET forming region, thus reducing in costs.

According to the profile of the well of each of the first to fifth embodiments described above, as is apparent from FIG. 22, the peak of the concentration of phosphorus ions reaches deep inside the substrate, whereas that of the concentration of boron ions is formed near the surface of the substrate. A high-concentration well can be formed by activating these impurity ions, and the impurity ions can be activated without using any excessive heat treatment. Therefore, as shown in the first to fifth embodiments, even though the impurity ions are implanted after the element isolating oxide film, they are activated by the heat treatment in forming the gate oxide film thereby to form a well. Since the heat treatment is not excessive, the well can be formed relatively small, and the small well is therefore effective in miniaturizing the device.

Though not shown, a step of forming an element isolating oxide film after the impurity ions are implanted can be employed in the semiconductor device manufacturing method of the present invention. Since, in this case, an excessive heat treatment is added to the well, the impurity profile becomes gentle, the PN junction between each well and the substrate and between the wells is lessened, and the junction withstanding voltage is heightened. Since, as described above, the activation of impurity ions is promoted by the heat treatment, a deep well can be formed.

Figure 25:
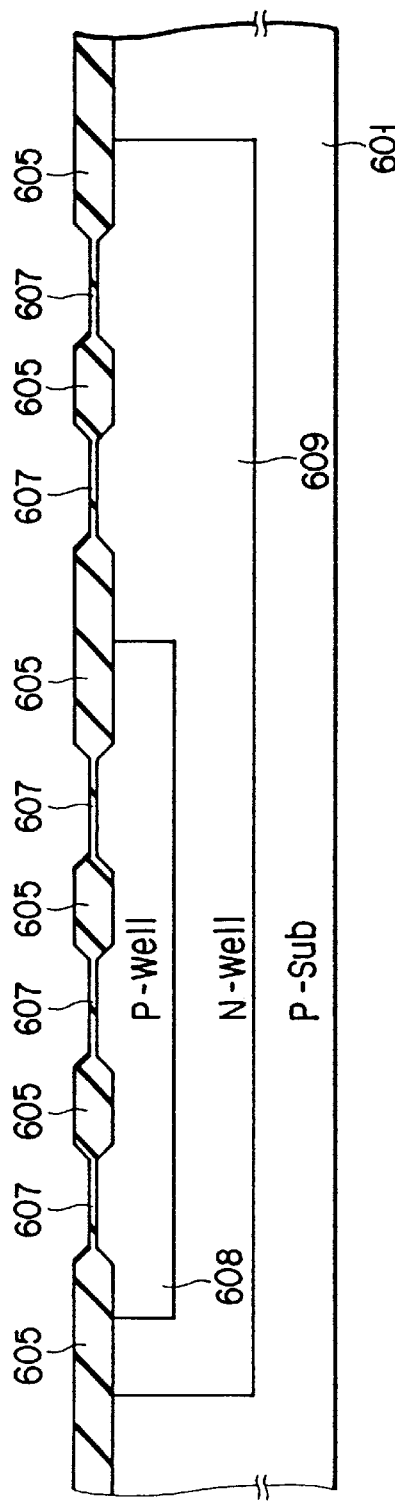
FIG. 25 is a cross-sectional view illustrating the next of manufacturing step of FIG. 24.
Figure 26:
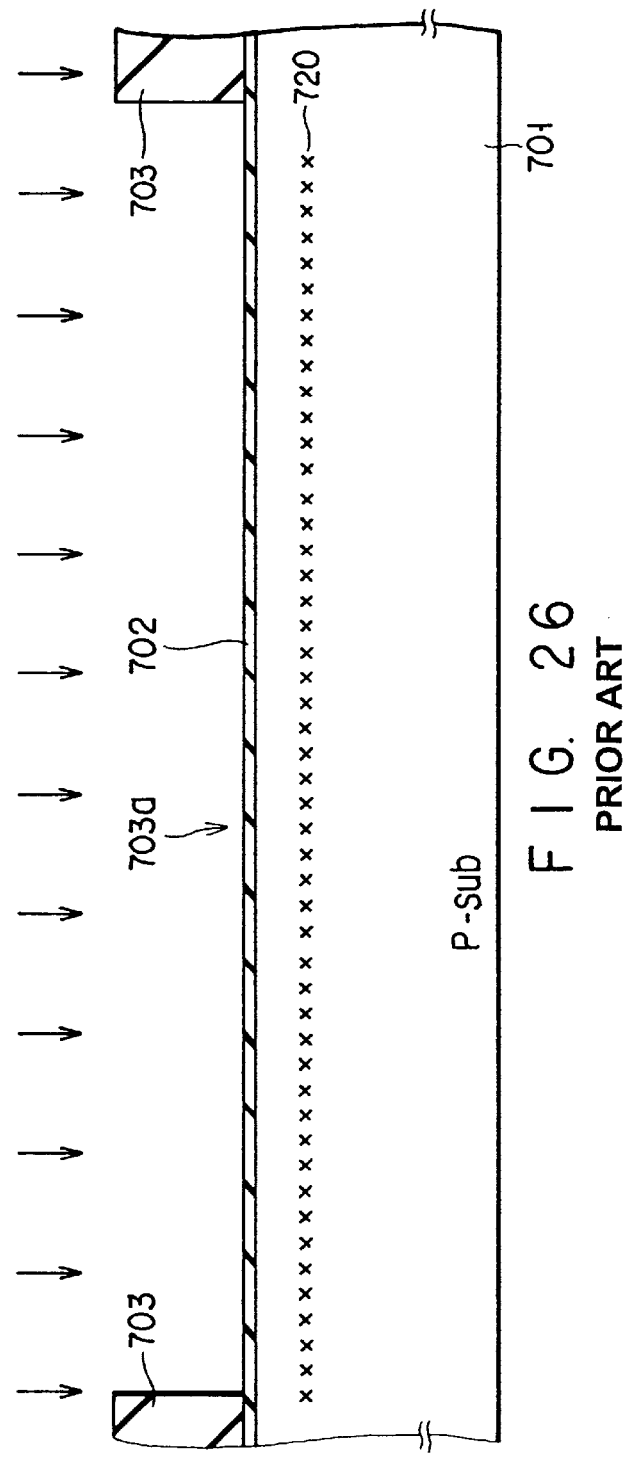
FIG. 26 is a cross-sectional view illustrating a manufacturing step of a conventional semiconductor device.
Figure 27:
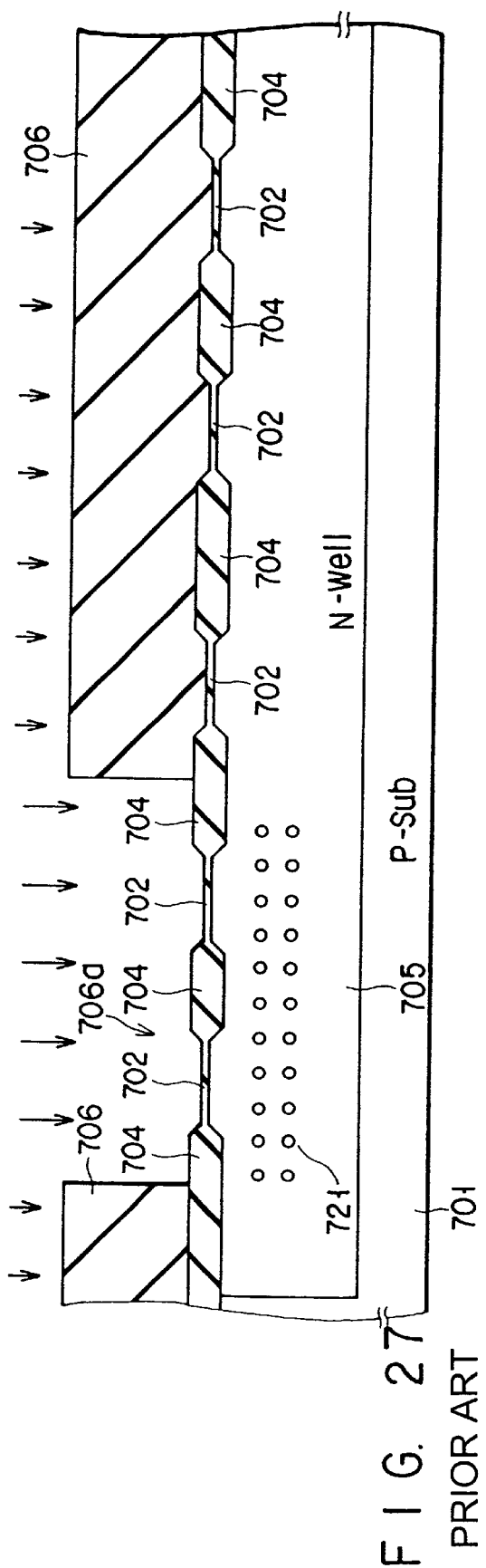
FIG. 27 is a cross-sectional view illustrating a next manufacturing step of FIG. 26.
Figure 28:
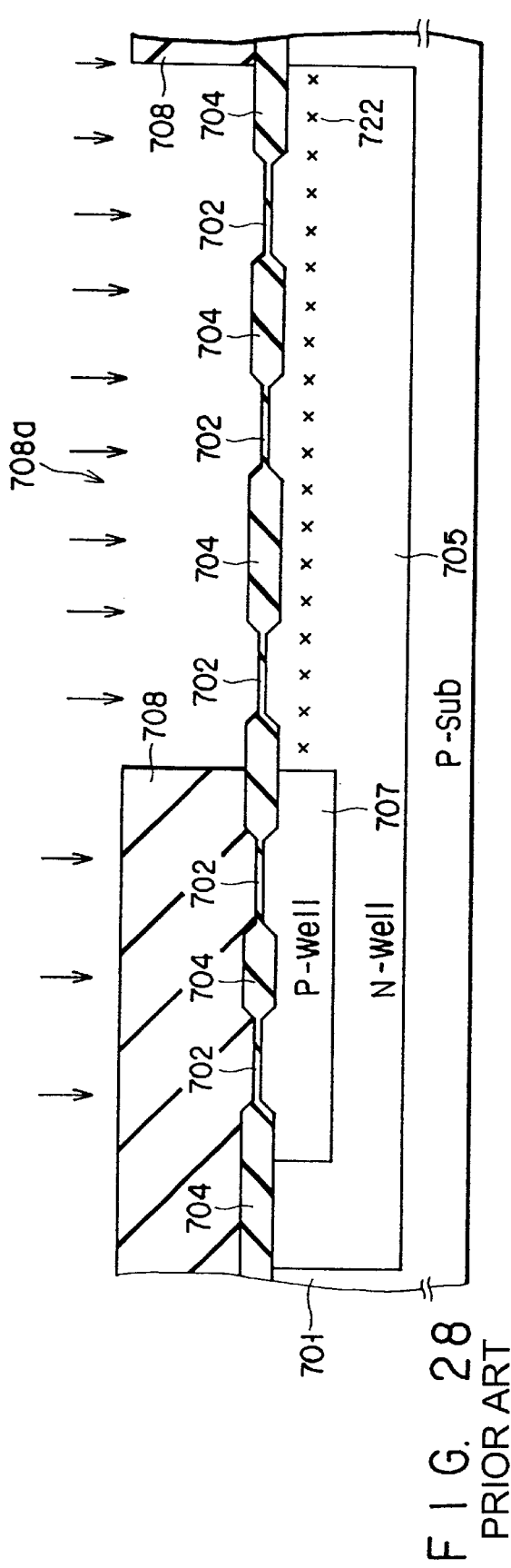
FIG. 28 is a cross-sectional view illustrating a next manufacturing step of FIG. 27.
Figure 29:
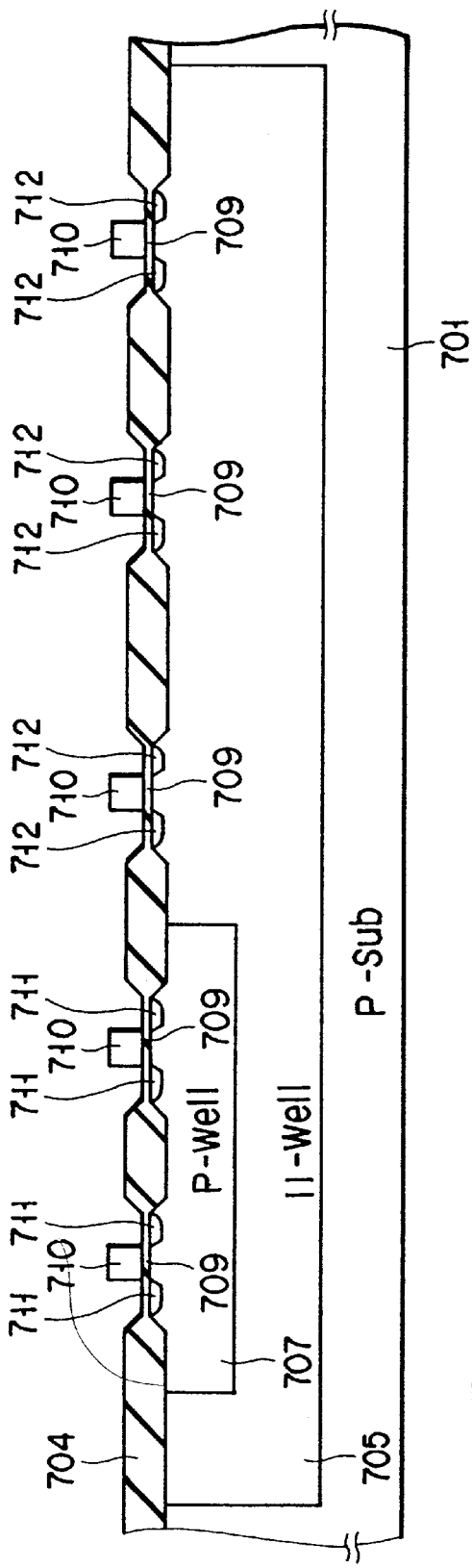
FIG. 29 is a cross-sectional view illustrating a next manufacturing step of FIG. 28.
Figure 30:
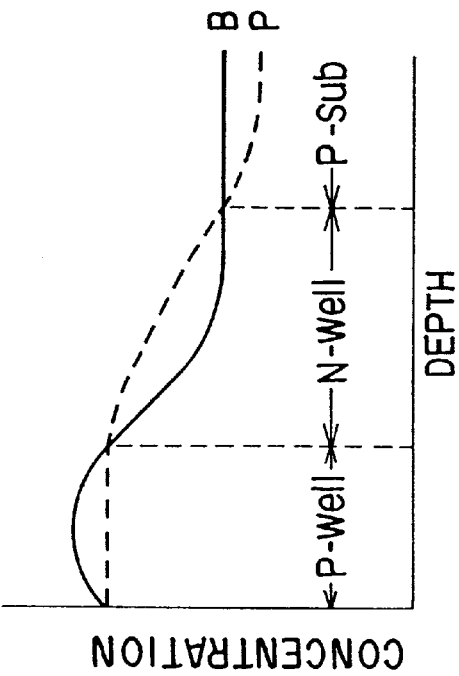
FIG. 30 is a profile of a region where a double well of the conventional semiconductor device.

The semiconductor device according to the first embodiment can also be manufactured by the steps illustrated in FIGS. 23 to 25. First, as shown in FIG. 23, a silicon oxide film 602 is formed on a P-type silicon substrate 601, and a resist pattern 603 surrounding a P-type well forming region which has to be electrically isolated from the substrate 601 and having an opening 603a corresponding to a PMOSFET forming region, is formed. Using the resist pattern 603 as a mask, phosphorus ions 620 are implanted.

The resist pattern 603 is removed and, as shown in FIG. 24, a plurality of element isolating oxide films 605 are formed. The phosphorus ions 620 are then activated by the heat treatment in forming the films 605 thereby to form an N-type well 606. A resist pattern 604 having an opening 604a corresponding to the P-type well forming region is formed. Using this pattern 604 as a mask, boron ions 621 and phosphorus ions 622 are implanted into the substrate 601.

After that, the silicon oxide film is removed and, as shown in FIG. 25, a gate oxide film 607 is formed. The boron ions 622 are then activated by the heat treatment in forming a gate oxide film to form a P-type well 608. The phosphorus ions 622 are also activated to form the above N-type well 606 and another N-type well 609 electrically isolated from the P-type well. Since the PN junction of the N-type well 609 is gentle, a junction withstanding voltage is increased between a P+ region of the drain and source diffusion layers of the PMOSFET to be formed in the N-type well 609 and its underlying N-type well.

In the foregoing first to fifth embodiments, impurities such as boron, arsenic and phosphorus can be implanted to form the P-type well electrically separated from the P-type silicon substrate, varying the acceleration energy in order to control the channel region of the NMOSFET. If the step of implanting these impurities is added, the channel region of the NMOSFET can be controlled so as to have a desired impurity profile. If, for example, arsenic and boron ions are implanted at an acceleration energy of about 40 keV, a leak current flowing between the source and drain regions of the NMOSFET can be controlled. Similarly, if impurities such as boron, arsenic and phosphorus are implanted to form the PMOSFET forming region, varying the acceleration energy in order to control the channel region of the PMOSFET, the channel region can be controlled so as to have a desired impurity profile.

As has been described above, the semiconductor device of the present invention is manufactured by implanting impurity ions to a predetermined depth of the semiconductor substrate by controlling the ion implanting conditions in order to form a well. Since, therefore, the total of the impurities of the channel region of the MOSFET in the first well which can be electrically separated from the semiconductor substrate, is decreased, a high-speed operation can be achieved. Since, furthermore, the impurity concentration of the second well for separating the semiconductor substrate and the first well can be set, regardless of that of the first well, the device can be miniaturized by increasing the impurity concentration of the second well. Since, moreover, the profile of the MOSFET forming region is simplified, the MOSFET can easily be designed.

In the manufacturing method of the semiconductor device of the present invention, the impurity ions are implanted with efficiency, and the step of controlling the impurity concentration of the MOSFET forming region need not be required, thus reducing in costs.

In the process of designing a semiconductor device, for example, a hybrid system mixing a flash EEPROM and a logic, a peripheral circuit of the flash EEPROM and a circuit of the logic are designed separately from each other and then these circuits can be integrated; therefore, both the development period and development expense can greatly be reduced.

In the foregoing first to fifth embodiments, the P-type silicon substrate and P-type well are electrically separated from each other. It is needless to say that the same advantage can be obtained even when the conductivity types of the P-type silicon substrate and P-type well are opposite to each other.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate of a first conductivity type;
   a first well of the first conductivity type formed in a surface region of said semiconductor substrate; and
   a second well of a second conductivity type formed in said semiconductor substrate so as to surround a side of said first well and a bottom thereof,
   wherein a concentration of impurities of the second conductivity type in said first well is D1 and a concentration of impurities of the second conductivity type in said second well is D2, D1<D2, and the concentration of impurities of the second conductivity type in said first well, excluding impurities of any device sources or drains formed in said first well, either remains constant or increases with increasing depth.

2. A device according to claim 1, wherein a concentration of impurities of the first conductivity type in said first well is D3, D1<D3, a concentration of impurities of the first conductivity type in said second well is D4, and D4<D2.

3. A device according to claim 2, wherein said second well includes a MOS transistor of the first conductivity type.

4. A device according to claim 1, wherein said device further comprises a third well of the second conductivity type formed adjacent to maid second well, a concentration of impurities of the second conductivity type in said third well is D5, and D2<D5.

5. A device according to claim 4, wherein said second well and said third well each include a MOS transistor of the first conductivity type.

6. A semiconductor device comprising:
   a semiconductor substrate of a first conductivity type;
   a first impurity region of a second conductivity type formed in said semiconductor substrate from a first depth from a surface of said semiconductor substrate to a second depth from the surface of said semiconductor substrate which is greater than the first depth;
   a second impurity region of the second conductivity type contacting sides of said first impurity region and formed from the surface of said semiconductor substrate to the second depth;
   a third impurity region of the first conductivity type electrically isolated from said semiconductor substrate by said first impurity region and said second impurity region, a concentration of said third impurity region being equal to a concentration of said semiconductor substrate; and
   a fourth impurity region of the second conductivity type contacting a side of said second impurity region, a depth of said fourth impurity region being substantially equal to a depth of said third impurity region,
   wherein an impurity concentration of said first and second impurity regions is less than an impurity concentration of the third and fourth impurity regions, and an EEPROM cell is formed in said third impurity region and a logic circuit is formed in said fourth impurity region.

7. A device according to claim 6, further comprising:
   a MOS transistor of the first conductivity type formed in said second impurity region; and
   a MOS transistor of the second conductivity type formed in said third region.

8. A semiconductor device having a chip merged with a flash EEPROM and a logic circuit, comprising:
   a semiconductor substrate of a first conductivity type;
   a first impurity region of the first conductivity type formed from a surface of said semiconductor substrate to a first depth;
   a second impurity region of a second conductivity type located under said first impurity region and formed from the first depth to a second depth from the surface of said semiconductor substrate, the second depth being greater than the first depth;
   a third impurity region of the second conductivity type formed on sides of said first impurity region and said second impurity region from the sure of said semiconductor substrate to the second depth;
   a fourth impurity region of the second conductivity type formed on a side of said third impurity region, said fourth impurity region having a third depth from the surface of said semiconductor substrate which is substantially equal to the first depth; and
   a fifth impurity region of the first conductivity type formed on a side of said fourth impurity region, said fifth impurity region having a depth from the surface of said semiconductor substrate which is substantial equal to the first depth,
   wherein said first impurity region is isolated from said semiconductor substrate by said second impurity region and said third impurity region, and said first impurity region and said third impurity region serve to form an EEPROM cell and a peripheral circuit thereof, while said fourth and fifth impurity regions serve to form a logic circuit.

9. A semiconductor device comprising:
 a semiconductor substrate of a first conductivity type;
 a first well of the first conductivity type, formed in the semiconductor substrate, and having a concentration of impurities of a second conductivity type that, exclusive of impurities of any device sources or drains formed in an upper surface of the first well, either remains constant or increases with increasing depth throughout the first well, wherein the concentration of the impurities of the second conductivity type is lower than a concentration of the impurities of the first conductivity type; and
 a second well of the second conductivity type, formed in the semiconductor substrate so as to contact a side of said first well and a bottom thereof, and having a concentration of impurities of the second conductivity type that increases with depth through a first portion of the second well, and decreases with increasing depth through a second portion of the second well, wherein a side portion of said second well is formed using a plurality of implants.

10. The device of claim 9, wherein the second portion is located at a greater depth than the first portion.

11. The device of claim 9, wherein the concentration of impurities of the second conductivity type is greater in a third portion of the second well, located between the first portion and the second portion, than a concentration of impurities of the second conductivity type in any portion of the first well.

12. The device of claim 11, wherein the third portion is the only portion of the second well in which the concentration of impurities of the second conductivity type reins constant with increasing depth.

13. The device of claim 9, wherein a concentration of impurities of the first conductivity type in the first well is substantially the same as a concentration of impurities of the first conductivity type in the semiconductor substrate.

14. The device of claim 9, further comprising a third well of the second conductivity type formed in contact with the second well, having a depth from a surface of the semiconductor substrate that is substantially the same as a depth from the surface of the semiconductor substrate of the first well.

15. The device of claim 14, further comprising a fourth well of the first conductivity type formed in contact with the third well having a depth from the surface of the semiconductor substrate that is substantially the same as the depth from the surface of the semiconductor substrate of the first well.

16. The device of claim 15, wherein the first and second wells are used to form an EEPROM cell, and the third and fourth wells are used to form a logic circuit.

17. The device of claim 9, further comprising a third well of the second conductivity type formed in contact with the second well, and having a concentration of impurities of the second conductivity type that is different from the concentration of impurities of the second conductivity type in the second well.

18. The device according to claim 1, further comprising an EEPROM cell being formed in the first impurity region.

19. The device according to claim 9, further comprising an EEPROM cell being formed in the first impurity region.

20. A semiconductor device comprising:
 a semiconductor substrate of a first conductivity type;
 a first impurity region of the first conductivity type formed from a surface of said semiconductor substrate to a first depth;
 a second impurity region of a second conductivity type located under said first impurity region and formed from the first depth to a second depth, the second depth being greater than the first depth; and
 a third impurity region of the second conductivity type formed on sides of said first impurity region and said second impurity region from the surface of said semiconductor substrate to the second depth, wherein an impurity concentration of said third impurity region is higher than an impurity concentration of said second impurity region, and said third impurity region is formed using a plurality of implants.

21. The device according to claim 20, further comprising an EEPROM cell being formed in said first impurity region.

22. A semiconductor device comprising:
 a semiconductor substrate of a first conductivity type;
 a first impurity region of the first conductivity type formed from a surface of said semiconductor substrate to a first depth;
 a second impurity region of a second conductivity type located under said first impurity region and formed from the first depth to a second depth, the second depth being greater than the first depth;
 a third impurity region of the second conductivity type formed on sides of said first impurity region and said second impurity region from the surface of said semiconductor substrate to the second depth using a plurality of implants, wherein an impurity concentration of said third impurity region is higher than an impurity concentration of said second impurity region, and a MOS transistor is formed in said third impurity region; and
 a fourth impurity region of the second conductivity type formed in said semiconductor substrate, wherein a MOS transistor is formed in said fourth impurity region.

23. A. The device according to claim 22, further comprising an EEPROM cell being formed in said first impurity region.

24. A semiconductor device comprising:
 a semiconductor substrate of a first conductivity type;
 a first impurity region of the first conductivity type formed from a surface of said semiconductor substrate to a first depth;
 a second impurity region of a second conductivity type located under said first impurity region and formed from the first depth to a second depth, the second depth being greater than the first depth; and
 a third impurity region of the second conductivity type formed on sides of said first impurity region and said second impurity region using a plurality of implants, wherein an impurity concentration of said third impurity region is higher than an impurity concentration of said second impurity region, and a MOS transistor is formed in said third impurity region.

25. A semiconductor device comprising:
 a semiconductor substrate of a first conductivity type;
 a first impurity region of the first conductivity type formed from a surface of said semiconductor substrate to a first depth;
 a second impurity region of a second conductivity type located under said first impurity region and formed from the first depth to a second depth, the second depth being greater than the first depth;

a third impurity region of the second conductivity type formed on sides of said first impurity region and said second impurity region using a plurality of implants, wherein an impurity concentration of said third impurity region is higher than an impurity concentration of said second impurity region, and a MOS transistor is formed in said third impurity region; and a fourth impurity region of the second conductivity type formed in said semiconductor substrate, wherein a MOS transistor is formed in said fourth impurity region.

26. A semiconductor device comprising:

a semiconductor substrate of a first conductivity type;

a first well of the first conductivity type formed in a surface region of said semiconductor substrate;

a second well of a second conductivity type formed in said semiconductor substrate so as to surround a side of said first well and a bottom thereof, wherein said second well is formed using a plurality of implants; and an EEPROM cell formed in the first well, wherein a concentration of impurities of the second conductivity type in said first well is D1 and a concentration of impurities of the second conductivity type in said second well is D2, D1<D2, and the concentration of impurities of the second conductivity type in said first and second wells, excluding impurities of any device sources and drains formed in said first well, has only a single peak which is located in said second well.

27. A semiconductor device according to claim 26, further comprising a MOS transistor which constitutes a peripheral circuit, and is formed in the first well.

28. A semiconductor device, comprising:

a semiconductor substrate of a first conductivity type;

a first well of the first conductivity type formed in said semiconductor substrate; and a second well of a second conductivity type formed in said semiconductor substrate, and surrounding a side and bottom of said first well, wherein a bottom portion of said second well is formed using an implant at a first energy level, and a side portion of said second well is formed using an implant at said first energy level, and a plurality of further implants at a plurality of energy levels other than said first energy level.

29. A semiconductor device comprising:

a semiconductor substrate of a first conductivity type;

a first well of the first conductivity type formed on a surface region of said semiconductor substrate; and a second well of a second conductivity type formed in said semiconductor substrate so as to surround a side of said first well and a bottom thereof, wherein a portion of said second well beside said first well is formed using a plurality of implants, and wherein a concentration of impurities of the second conductivity type in said first well is D1 and a concentration of impurities of the second conductivity type in said second well is D2, D1<D2, and the concentration of impurities of the second conductivity type in said first well, excluding impurities of any device sources or drains formed in said first well, either remains constant or increases with increasing depth.

* * * * *